United States Patent [19]

Davis

[11] 4,128,742
[45] Dec. 5, 1978

[54] RUGGED CROSSPOINTS FOR COMMUNICATION SYSTEMS

[75] Inventor: James A. Davis, Glen Ellyn, Ill.

[73] Assignee: Bell Telephone Laboratories, Incorporated, Murray Hill, N.J.

[21] Appl. No.: 824,851

[22] Filed: Aug. 15, 1977

[51] Int. Cl.² .............................................. H04Q 3/52
[52] U.S. Cl. .............................. 179/18 GF; 307/315; 340/166 R
[58] Field of Search ................... 179/18 GF; 307/315, 307/313; 340/166 R

[56] References Cited

U.S. PATENT DOCUMENTS

| 3,828,314 | 8/1974 | Bradbery et al. | 179/18 GF |
| 3,872,439 | 3/1975 | Salam | 340/166 R |
| 3,886,369 | 5/1975 | Porter | 179/18 GF |
| 4,032,892 | 6/1977 | Matsuyama et al. | 179/18 GF |

Primary Examiner—Thomas A. Robinson
Attorney, Agent, or Firm—Peter Visserman

[57] ABSTRACT

A bilateral solid-state crosspoint for use in a telecommunications switching network is disclosed comprising a pair of Darlington connected pairs of transistors connected in a complementary relationship. The transmission path in each direction through the crosspoint comprises a Darlington connected pair of transistors and one additional semiconductor junction. A control circuit provides base drive to the transistors to close the crosspoint.

8 Claims, 3 Drawing Figures

RUGGED CROSSPOINTS FOR COMMUNICATION SYSTEMS

FIELD OF THE INVENTION

This invention relates to crosspoints (transmission switches for voice and data) and more particularly to crosspoints which are capable of withstanding both high voltage and high current conditions occasioned by signaling and environmental conditions.

BACKGROUND OF THE INVENTION

Where a communication line, e.g., a telephone line extends outside a switching center, both the line and the connected equipment are potentially subject to foreign potentials through 60 Hz power line induction and accidental crosses. Additionally, telephone switching systems utilize high current and high voltage signaling sources for ringing, coin control, etc. For example, in selective ringing telephone systems 88 VRMS 20 Hz ringing voltage superimposed on negative and positive 48 volt battery are utilized for alerting subscriber stations. The potentials on such lines may reach +175 volts and −175 volts and switches in a network utilized to connect such signals to a line may be subjected to this entire difference in potential of 350 volts. Longitudinal voltages caused by induction from 60 Hz electrical transmission lines add to the requirement for high breakdown voltage in crosspoints. Taking into consideration the above effects of selective ringing and longitudinal signals, the crosspoints of a network should have a breakdown potential, of either positive or negative polarity, in excess of 425 volts or more.

The current carrying capacity requirement of a crosspoint in a telephone system is determined by: the talking line feed current (possibly as high as 100 milliamps); the current caused by coin control signals (60 to 100 mA); longitudinal currents (in the order of plus or minus 30 milliamps); and ringing current peaks up to 100 mA or more. The above factors indicate that a crosspoint for a telephone switching system should be able to handle on the order of 150 milliamps.

Metallic crosspoints because of their favorable electrical characteristics have been widely used as switching elements in communication switching systems. Metallic switches are capable of withstanding high current and high voltage, they have low impedance bilateral transmission characteristics and there is separation of the control and transmission lines in such switches.

Semiconductor devices, other than PNPN structures, generally are lacking in physical characteristics necessary to withstand the above-described conditions of circuit application. However, PNPN structures, while capable of withstanding high current and high potential, have many operating disadvantages. PNPN devices can be inadvertently turned-ON by rapid transient changes in voltage on the anode or cathode of the device making reliable operation of a PNPN network in a noisy, unconditioned environment very difficult. Also, the usefulness of PNPN crosspoints are limited by the fact that they cannot break current (except for special gate turn-OFF PNPNs which typically require large control voltages and currents to effect turn-OFF). Finally, the self-latching characteristic of PNPNs cannot be utilized in the proposed applications because PNPNs would turn-OFF with a current reversal such as occurs, for example, during ringing.

SUMMARY OF THE INVENTION

In accordance with the present invention a bidirectional crosspoint for inclusion in the single line of an unbalanced communication path, or in the two lines of a balanced communication path, comprises a pair of Darlington connected pairs of transistors connected in a complementary relationship. The transmission path in each direction through the crosspoint comprises a Darlington connected pair of transistors and one additional semiconductor junction.

Advantageously, crosspoints constructed in accordance with this invention provide low loss, low distortion, bilateral transmission of bipolar signals of reasonable magnitude when the crosspoints are biased to operate in a portion of a current-voltage characteristic which is removed from the zero crossing of that characteristic. Furthermore, such crosspoints are capable of transmitting standard ringing and coin control signals as well as line battery feed. Additionally, crosspoints constructed in accordance with this invention are able to withstand the high operating and environmental voltages which they may be subjected to when utilized in a telephone switching system.

In accordance with one aspect of this invention, the added semiconductor junction in each transmission path comprises a semiconductor diode connected in series with the transistors of each Darlington pair. The complementary connection of the Darlington pairs is such that two unilateral transmission paths, each comprising a Darlington pair of transistors and a diode, are connected in reverse parallel relationship. That is, the transistors of one Darlington pair and the associated diode are poled in a first direction while the transistors of the other Darlington pair and the associated diode are poled in the opposite direction.

In accordance with an alternate arrangement, the complementary connection of the two Darlington connected pairs is such that one transmission path through the crosspoint comprises the transistors of one Darlington pair and the base to collector junction of the control transistor of the other Darlington pair. Similarly the other transmission path comprises the transistors of the other Darlington pair and the base to collector junction of the control transistor of the one Darlington pair.

In accordance with another aspect of this invention, turn-ON current for the control transistors of the Darlington pairs of a crosspoint may be provided, for example, by current source transistors or alternatively the control transistors of each Darlington pair may be light responsive and control effected through light emitting diodes or other light sources. Furthermore, other control circuit arrangements can be devised for control of the Darlington pair.

DETAILED DESCRIPTION

Figure 1:
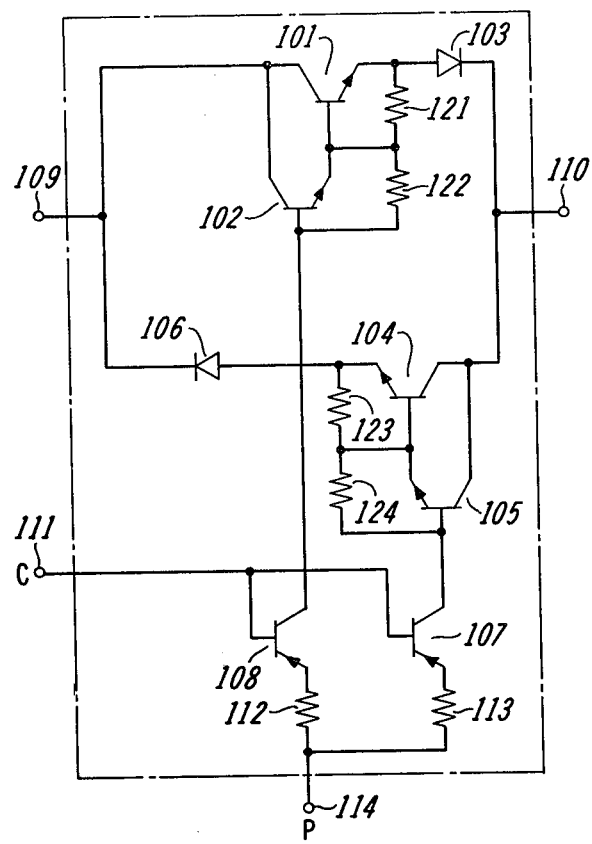
FIG. 1 is a schematic diagram of a first embodiment of a crosspoint in accordance with the present invention.

The crosspoints shown in FIG. 1 comprise the two transmission terminals 109 and 110, a first unidirectional transmission path comprising the Darlington connected transistors 101 and 102 and the series connected diode 103 between the terminals 109 and 110; and a second unidirectional transmission path comprising the Darlington connected transistors 104 and 105 and the series connected diode 106. The control circuitry comprising the transistors 107 and 108, the resistors 112 and 113, the power terminal 114, and the control terminal 111 serves to selectively supply current to the Darlington pairs to place all four of the transistors 101, 102, 104, and 105 in the conducting mode at the same time. Current supplied to the base of the transistors 102 and 105 by transistors 108 and 107, respectively, must be returned by the external circuitry connected to one or both of the transmission terminals 109 and 110.

Control signals applied to the control terminal 111, in cooperation with power applied to the power terminal 114, serve to control the current source transistors 107 and 108. When the control signal on the control terminal 111 is such that the transistors 107 and 108 are functioning as current sources, current derived from a supply connected to the power terminal 114 will flow through the transistors 107 and 108 to the base of the transistor 105 and the base of the transistor 102, respectively. For proper operation of the crosspoint, the current supplied by the current source transistors 107 and 108 should be sufficient to saturate transistors 105 and 102, respectively, for all values of current between terminals 109 and 110 occurring under normal operating conditions. Under these conditions, transistors 102, 101, 105, and 104 provide two low loss, reverse poled, unidirectional transmission paths between transmission terminals 109 and 110. Signals of one polarity applied between the transmission terminals 109 and 110 will be transmitted via the first unidirectional transmission path comprising the Darlington connected pair of transistors 101, 102 and the series diode 103; while signals of the opposite polarity applied between the terminals 109 and 110 will be transmitted via the Darlington connected pair of transistors 104, 105 and their series connected diode 106.

Figure 2:
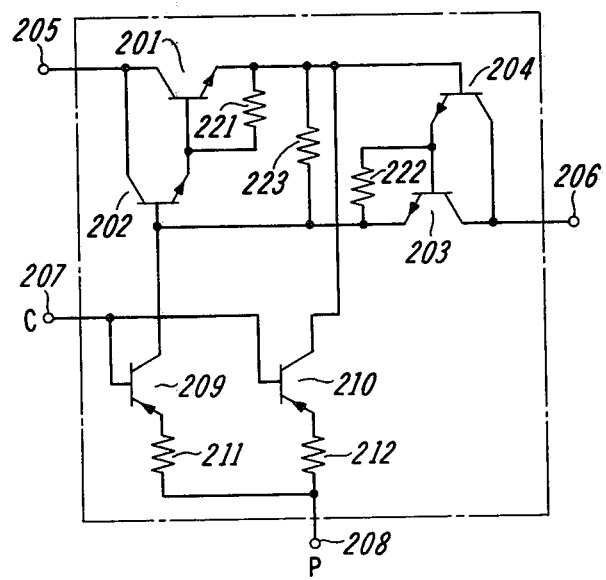
FIG. 2 is a schematic diagram of a second embodiment of a crosspoint in accordance with the present invention.

The diodes 103 and 106 of FIG. 1 are utilized to protect the relatively low breakdown voltage emitter-base junctions of transistors 101, 102 and 104, 105, respectively. The addition of the diodes enables the crosspoint in the OFF state to withstand higher voltages of either polarity between terminals 109 and 110, than is afforded by the two Darlington connected pairs of transistors. A second embodiment of a crosspoint in accordance with the present invention, which is shown in FIG. 2, provides a breakdown potential between the transmission terminals 205 and 206 which is comparable to the breakdown potential of the circuit of FIG. 1, without the use of separate diodes, between the transmission terminals 109 and 110. In the circuit of FIG. 2 two Darlington connected pairs comprising the transistors 201, 202, 203, and 204 are interconnected such that a base to collector junction of a transistor of one pair is connected in series in the transmission path of the other Darlington pair. In FIG. 2, one of the two unidirectional transmission paths between the transmission terminals 205 and 206 comprises the Darlington connected pair of transistors 201 and 202 and the base to collector junction of the transistor 204 for one direction of transmission, and the Darlington connected pair of transistors 203 and 204 and the base to collector junction of the transistor 202 for the other direction of transmission.

The transistors 209 and 210, the resistors 211 and 212, the power terminal 208, and the control terminal 207 are comparable to the control circuitry shown in FIG. 1. Signals applied to the control terminal 207 in cooperation with a potential applied to the terminal 208 control transistors 209 and 210 to supply the current necessary to turn-ON the transistors 202 and 204, and consequently, the transistors 201 and 203. When in the ON state, the transistors 201, 202, 203, and 204 provide a low impedance, bidirectional transmission arrangement between the terminals 205 and 206. As in the circuit of FIG. 1, the control currents for the transistors 201 through 204 are returned via external circuitry connected to the terminals 205 and 206, and not shown herein.

The resistors 121, 122, 123, and 124 are connected across the base to emitter junctions of transistors 101, 102, 104, and 105, respectively, to provide a leakage current path around the transistors as a further breakdown protection device when the crosspoint is in the OFF state. Similarly, the resistors 221, 222, and 223 are provided in the circuit arrangement of FIG. 2 to provide a leakage path in the OFF state.

The crosspoints of FIGS. 1 and 2 both provide low impedance, bidirectional transmission paths for communication signals of reasonable amplitude and are capable of passing DC control signals of both polarities. High level ringing current signals may experience some wave shape distortion of the current zero crossing when transmitted through such crosspoints. However, such distortion is not intolerable in the operation of a telephone system.

Figure 3:
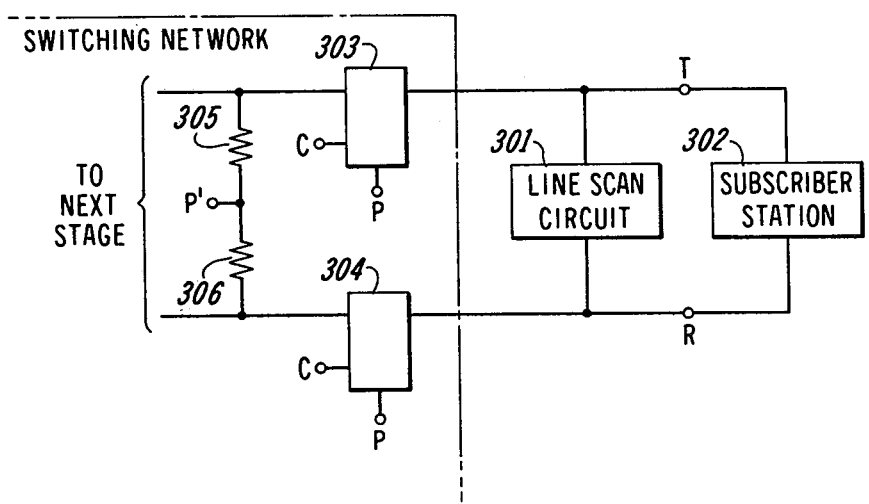
FIG. 3 illustrates the application of two crosspoints in accordance with this invention in a balanced transmission path.

FIG. 3 shows a balanced transmission arrangement comprising tip and ring conductors labeled T and R respectively, a line scan circuit 301 for use in ascertaining the on-hook or off-hook state of the subscriber station 302, two crosspoint circuits 303 and 304 connected, respectively, in the tip and ring conductors of the transmission path, and resistors 305 and 306 for returning the control current for the crosspoints 303 and 304. Either of the two embodiments of crosspoints shown in FIGS. 1 and 2, may be utilized as the crosspoints 303 and 304 of FIG. 3. For example, if the embodiment of FIG. 1 is used the terminals 109 and 110 are connected serially in the tip and ring conductors T and R, control signals are applied to the crosspoints at the terminal labeled C (111 in FIG. 1), and a power source is applied to the terminal labeled P (114 in FIG. 1). Similarly, if the crosspoint embodiment shown in FIG. 2 is used in the implementation of the arrangement of FIG. 3, the terminals 205 and 206 are connected in the tip and ring conductors of FIG. 3. In that case, control terminal C is equivalent to terminal 207 and terminal P is equivalent to terminal 208. The terminal P' between resistors 305 and 306 forms a connecting point for a second terminal of the power source to be connected to terminal P.

It is to be understood that the above-described arrangement is merely an illustrative application of the principles of the invention and that various other arrangements may be devised by those skilled in the art without departing from the spirit and scope of the invention.

What is claimed is:

1. An analog switching circuit arrangement comprising:

first and second transmission terminals; and a crosspoint comprising: first and second Darlington connected pairs of transistors connected in complementary relation to form two oppositely poled transmission paths between said first and second transmission terminals, each of said paths comprising a Darlington connected pair of transistors and one additional series connected semiconductor junction; and control means for selectively supplying control current to said Darlington pairs to place all of said transistors in the conducting state at the same time.

2. An analog switching circuit arrangement in accordance with claim 1 wherein said additional semiconductor junction in each transmission path comprises a diode poled in the same direction as the transistors of the Darlington pair in the same transmission path.

3. An analog switching circuit arrangement in accordance with claim 1 wherein said additional series connected semiconductor junction in each transmission path comprises a base to collector junction of one of the transistors in the other transmission path.

4. An analog switching circuit arrangement in accordance with claim 1 wherein said control means comprises first and second control transistors comprising collector terminals connected respectively to the base of one of the Darlington connected transistors in the respective first and second transmission paths, the bases of said control transistors being connected together and to a control terminal and the emitters of said control transistors being connected via individual resistors to a potential terminal.

5. An analog switching circuit arrangement comprising:

first and second transmission terminals;

a crosspoint comprising: first and second oppositely poled unidirectional transmission paths interconnecting said first and second transmission terminals, each of said transmission paths comprising:
first and second NPN transistors, the collectors of said transistors connected together and to one of said transmission terminals, the emitter of said first transistor coupled to said other transmission terminal by semiconductor means poled in the same direction as the base to emitter junction of said first transistor, the emitter of said second transistor connected to the base of said first transistor; and control means coupled to the base of said second transistor for placing both said first and said second transistors in the conducting mode.

6. An analog switching circuit arrangement in accordance with claim 5 wherein said control means comprises one PNP control transistor for each of said transmission paths and means for simultaneously controlling the PNP transistors associated with said first and second transmission paths.

7. An analog switching circuit arrangement in accordance with claim 5 wherein said semiconductor means coupling the emitter of said first transistor to said other transmission terminal comprises a diode having the anode connected to the emitter of said first transistor and the cathode connected to said other transmission terminal.

8. An analog switching circuit arrangement in accordance with claim 5 wherein said semiconductor means coupling the emitter of said first transistor to said other transmission terminal comprises the base to collector junction of one of the transistors in the oppositely poled unidirectional transmission path.

* * * * *